United States Patent [19]

Kano et al.

[11] 3,746,950

[45] July 17, 1973

[54] PRESSURE-SENSITIVE SCHOTTKY BARRIER SEMICONDUCTOR DEVICE HAVING A SUBSTANTIALLY NON-CONDUCTIVE BARRIER FOR PREVENTING UNDESIRABLE REVERSE-LEAKAGE CURRENTS AND METHOD FOR MAKING THE SAME

[75] Inventors: Gota Kano, Otokuni-gun; Mutsuo Iizuka, Kitakawachi-gun; Shohei Fujiwara; Hiromasa Hasegawa, both of Takatsuki City; Tsukasa Sawaki, Toyonaka, all of Japan

[73] Assignee: Matsushita Electronics Corporation, Oaza-Kadoma, Kadoma City, Osaka Prefecture, Japan

[22] Filed: Aug. 15, 1969

[21] Appl. No.: 850,372

[30] Foreign Application Priority Data

Aug. 27, 1968 Japan .............................. 43/61958

[52] U.S. Cl. .... 317/235 R, 317/234 R, 317/234 M, 317/235 M, 317/235 U, 317/235 AJ

[51] Int. Cl. ........................ H01l 11/00, H01l 15/00

[58] Field of Search ...................... 317/234, 235, 26, 317/31, 47, 46, 40, 40.1, 47.8

[56] References Cited

UNITED STATES PATENTS

| | | | |
|---|---|---|---|
| 3,518,508 | 6/1970 | Yamashita et al. | 317/235 |
| 3,087,099 | 4/1963 | Lehovec | 317/235 |
| 3,424,627 | 1/1969 | Michel et al. | 317/235 X |
| 3,443,041 | 5/1969 | Kahng et al. | 317/235 |
| 3,513,366 | 5/1970 | Clark | 317/235 |

FOREIGN PATENTS OR APPLICATIONS

| | | | |
|---|---|---|---|
| 1,433,160 | 5/1965 | France | 317/234 |

*Primary Examiner*—John W. Huckert
*Assistant Examiner*—Andrew J. James
*Attorney*—Craig & Antonelli

[57] ABSTRACT

A pressure-sensitive semi-conductor device with a Schottky barrier in which a separation space is formed underneath the insulating film covering a major surface portion of the semi-conductor substrate and disposed adjacent a metal layer received in a recess in the substrate and extending through an opening in the insulating film, whereby the input pressure is applied to the metal layer. The separation space is formed by side-etching with the insulating film serving as mask.

15 Claims, 4 Drawing Figures

Patented July 17, 1973 3,746,950
FIG. 1
(PRIOR ART)
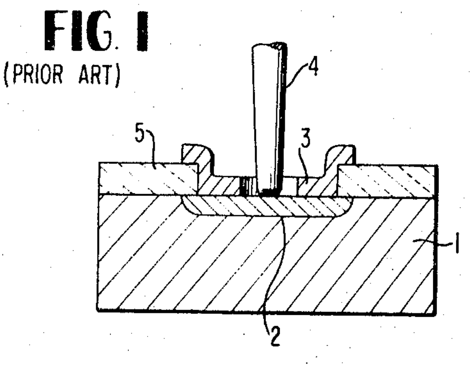
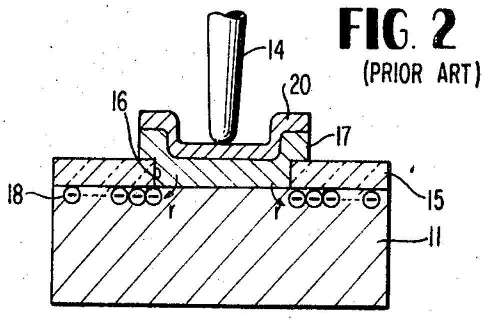
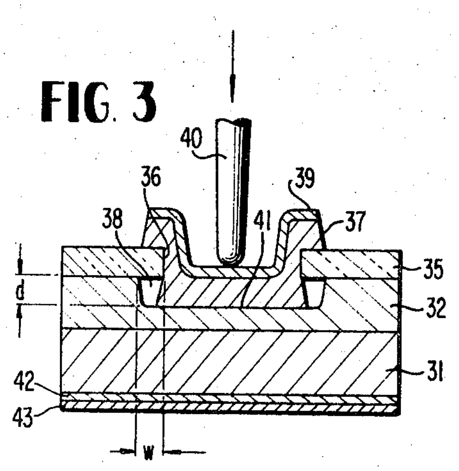
FIG. 4
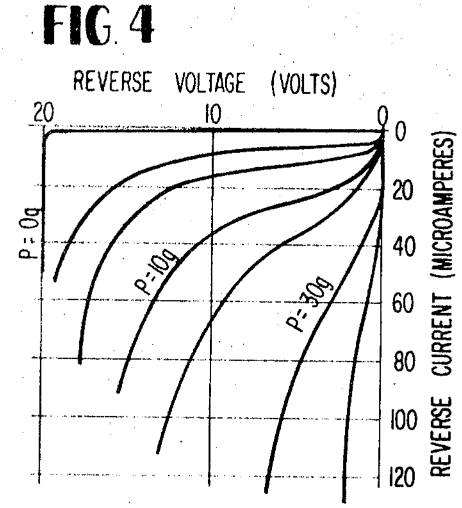
INVENTORS
GOTA KANO
MUTSUO IIZUKA
SHOHEI FUJIWARA
HIROMASA HASEGAWA
TSUKASA SAWAKI
BY
Craig, Antonelli, Stewart & Hill
ATTORNEYS

PRESSURE-SENSITIVE SCHOTTKY BARRIER SEMICONDUCTOR DEVICE HAVING A SUBSTANTIALLY NON-CONDUCTIVE BARRIER FOR PREVENTING UNDESIRABLE REVERSE-LEAKAGE CURRENTS AND METHOD FOR MAKING THE SAME

BACKGROUND OF THE INVENTION

This invention relates to a pressure-sensitive semi-conductor device capable of changing its electric characteristics in response to a pressure applied to its rectifying barrier, and relates to a method of making such semi-conductor device. More particularly, this invention relates to a pressure-sensitive semi-conductor device having a Schottky barrier to which pressure is applied, and relates to a method of making the same.

It is well known that in a semi-conductor device having a p-n junction, such as a diode, reverse voltage vs. current characteristics change when an appropriate pressure is applied to the p-n junction. Such device is explained, referring to FIG. 1, which illustrates a cross-sectional elevation view of the device, wherein an impurity-diffused region 2 is provided on a semi-conductor substrate 1. A pressure needle 4 is applied to the surface of the impurity-diffused region 2. A lead-out metal layer 3 is provided on a part of the surface of the region 2. The reverse voltage vs. current characteristics can be changed in response to the pressure applied to the impurity-diffused region 2 by the pressure needle 4, so that pressure-electricity conversion is obtained. In such conventional pressure-electric conversion device of p-n junction type, the impurity-diffused region 2 is so thick, for example, several microns, as to disable acceptable concentration of the contact pressure. Consequently, such device has the drawback that sensitivity of its pressure-electricity conversion is low.

It is also theoretically known that a semi-conductor device having a Schottky barrier, such as a diode, varies its reverse voltage vs. current characteristics when appropriate pressure is applied to its barrier. Such a device is explained by reference to FIG. 2 which illustrates a cross-sectional elevation view of the device, wherein an insulating film 15 is provided on a semi-conductor substrate 11. An opening 16 is made through the insulating film 15, and then a layer 17 of a specified metal and a protecting metal layer 20 are provided on a surface of the substrate 11 exposed through the opening 16 forming a Schottky rectifying barrier between the metal layer 17 and the semi-conductor substrate 11. A pressure needle 14 concurrently serving as a lead-out wire is disposed to contact the metal layer 20, for imparting appropriate pressure to the rectifying barrier. The reverse voltage vs. current characteristics can be changed in response to the pressure applied to said rectifying barrier. In such pressure-electricity conversion device of the Schottky barrier type, an electric charge accumulation layer 18 is liable to be formed in a portion of the semi-conductor substrate 11 closely underneath the insulating film 15. This formation of the accumulation layer 18 allows the reverse leakage current to flow as indicated by arrows *r* and *r'* in FIG. 2, resulting in lowering the sensitivity of pressure-electricity conversion, and also in making the conversion characteristic unstable, thereby rendering the device practically useless.

SUMMARY OF THE INVENTION

Accordingly, it is an object of the present invention to provide an improved pressure-sensitive semi-conductor device and also a method of making the same.

Another object of the present invention is to provide an improved pressure-sensitive semi-conductor device operable with higher sensitivity and at higher frequencies in comparison with conventional pressure-sensitive semi-conductor devices.

The pressure-sensitive semi-conductor device of the present invention comprises:

a semi-conductor substrate having a recess formed in a region of n-type conductivity;

an insulating film covering a major surface portion of the semi-conductor substrate but exposing by its opening a major part of the recess so that a side-etched separation space extending around the recess is located underneath the insulation film;

a metal layer deposited to cover the recess and the surrounding insulating film which retains the side-etched separation space vacant so that a Schottky barrier surrounded by the separation space is formed in the recess; and a means for applying the input pressure onto the metal layer.

The pressure-sensitive device according to the present invention constitutes a semi-conductor device of the planar type construction. The metal layer deposited on the recessed surface of the n-type region of semi-conductor substrate forms a Schottky rectifying barrier therebetween. The vacant side-etched separation space located underneath the insulating film and around the metal layer deposited in the recessed surface serves to insulate the Schottky barrier from the electric charge accumulation layer so as to eliminate the undesirable reverse leakage current, and consequently to improve the sensitivity of the pressure-electricity conversion. Since the metal layer can be formed so thin as to be less than 1 micron, thereby enabling the acceptable concentration of the pressure at the barrier, high sensitivity in the pressure-electricity conversion is obtainable.

BRIEF DESCRIPTION OF THE DRAWING

The invention will be more fully understood by reference to the following detailed description of the specific embodiment thereof taken in conjunction with the drawing, wherein:

FIG. 1 is a cross-sectional elevation view of one type of pressure-sensitive semi-conductor device of the prior art, as described hereinabove;

FIG. 2 is a cross-sectional elevation view of another type of pressure-sensitive semi-conductor device of the prior art, as also described hereinabove;

FIG. 3 is a cross-sectional elevation view of a pressure-sensitive semi-conductor diode in accordance with the present invention; and FIG. 4 is a characteristic diagram showing the relation between reverse voltage and reverse current of an example of the diode shown in FIG. 3.

DETAILED DESCRIPTION

Referring now to FIG. 3, an epitaxially grown n-type region 32 having relatively low resistivity such as 0.5 ohm-cm is grown upon an n-type semi-conductor wafer having higher resistivity such as n-type silicon substrate 31 of 0.005 ohm-cm resistivity. An insulation film 35, such as of oxide of silicon or silicon nitride, is provided on the surface of the epitaxially grown region 32. Then, preferably a round opening 36 is made in the insulating film 35 by any known method, for instance, photo-etching, so as to expose therefrom the surface of the epitaxially grown region 32. Subsequently, the exposed surface of the epitaxially grown region 32 is chemically etched by any known method, for instance, immersion in a bath prepared by mixing nitric acid, fluoric acid and acetic acid in the volume ratio of 6:1:2, making use of the insulating film 35 as an etching mask.

In the above chemical etching, the epitaxially grown region 32 is engraved both perpendicularly or vertically, i.e., downwardly, and horizontally, i.e., radially. Such horizontal, i.e., radial etching is termed side-etching. It has been found experimentally that the etching front underneath the insulating film 35 in the horizontal, i.e., radial direction advances at the speed of several tenths of that in the perpendicular, i.e. downward direction.

As a consequence of this chemical etching, a recess 41 is formed in the epitaxially grown region 32 in such a way that the edge of chemically etched recess 41 extends underneath the insulating film 35 and beyond the boundary of the opening 36 on account of the side-etching. Thus, a circular side-etched separation space 38 extending around the recess 41 underneath the insulation film 35 is formed. The width W of the side-etched separation spacd 38 indicated in FIG. 3 may preferably have a value of at least 1,000A, and, accordingly, the depth *d* of the recess is preferably at least 3,000A.

Subsequently, a layer 37 of metal, such as molybdenum or tungsten, is sputtered through the opening 36 onto the bottom of the recess 41, in such a way that the side-etched separation space or guard space 38 is left vacant underneath the insulation film 35. A Schottky rectifying barrier is formed between the metal layer 37 and the recessed surface 41 of the epitaxially grown layer 32. Then, a protective layer 39 of metal such as gold is deposited on the metal film 37, and a pressure needle 40, which concurrently serves as a lead-out wire, is provided so that an input pressure is applied through it to the barrier. A layer 42 of metal, such as gold containing 3 percent of antimony, is deposited on the opposite surface of the semi-conductor substrate 31, so that an ohmic contact is obtained between the substrate 31 and the lead-out metal layer 43 deposited thereon.

In the above pressure-sensitive semi-conductor device, the side-etched separation space or guard space 38 serves to insulate the Schottky barrier from the electric charge accumulation layer which develops in a portion of epitaxially grown region 32 closely underneath the insulating film 35. Consequently, undersirable reverse leakage current originated by a leaking of electric charge from the accumulation layer to the metal layer is sufficiently eliminated, so that no substantial reverse leakage current exists in the device of the present invention, thereby resulting in good agreement with the theoretical value of the reverse breakdown characteristics.

Accordingly, sensitivity in pressure-electricity conversion can be considerably improved.

The characteristics of an example embodying the present invention are described hereinafter.

EXAMPLE

A pressure-sensitive semi-conductor device as described by reference to FIG. 3, is manufactured under the following particulars:

semi-conductor wafer 31 is an n-type silicon wafer having resistivity of 0.005 ohm-cm;

epitaxially grown layer 32 is an n-type silicon layer having resistivity of 0.5 ohm-cm and a thickness of 1.5 microns;

insulation film 35 is a 5,000A thick silicon dioxide film;

opening 36 has diameter of 25 microns;

etching in the epitaxially grown layer 32 is effected to reach the etching depth *d* of 3,000A and side-etch width W of 1,000A;

metal film 37 is formed by sputtering molybdenum to have the thickness of 2,000A;

metal film 39 is formed by vapor-deposition of gold to have the thickness of 3,000A;

pressure needle 40 is a tungsten wire having a hemispherical tip of 50 micron radius.

Characteristic curves of the above example are shown in FIG. 4, wherein the reverse current in microamperes is plotted along the ordinate while the reverse voltage in volts is plotted along the abscissa, the parameters of the curves showing the different pressures applied to the pressure-needle 40 in gram-weight.

As is shown in and understood from FIG. 4, the device of the present invention has almost negligible reverse leakage current, and prominent changeability of the height of Schottky barrier in response to a change of the pressure applied to the pressure needle 40.

As can be easily understood from the above description, the device of the present invention is usable even at supersonic frequencies, because the device of the present invention comprises the Schottky barrier in which the storage effect of holes, or minority carrier, does not occur.

We claim:

1. A pressure-sensitive semi-conductor device which comprises:

a semi-conductor substrate of n-type conductivity having a recess formed in a specified region thereof;

an insulating film covering a major surface portion of said semi-conductor substrate and having an opening therethrough exposing a major part of said recess, said opening being disposed above said recess, the cross-sectional area of said opening being less than the cross-sectional area of said recess, so as to provide a separation space in said semi-conductor substrate, that extends around the portion of the recess located underneath the insulating film;

a Schottky barrier formed at the bottom of said recess including a metal layer covering the opening in said insulating film and extending through said opening onto the bottom of said recess while leaving said separation space substantially vacant, said separation space extending to the base of said recess in said semiconductor substrate at the location where said Schottky barrier is formed, so that said Schottky barrier is surrounded by the separation space extending around the recess; and means for applying input pressure onto said metal layer.

2. The semi-conductor device of claim 1, wherein the width of said separation space is at least 1,000A.

3. The semi-conductor device of claim 1, wherein the semi-conductor substrate is of n-type silicon, the insulating film is of silicon dioxide, and the metal layer is of sputtered molybdenum.

4. The semi-conductor device of claim 1, wherein said means for applying the input pressure onto said metal layer includes a pressure needle imparting the input pressure onto the metal layer by way of its tip and simultaneously serving as a lead-out wire.

5. A pressure-sensitive semi-conductor device in which an insulating film covers a major surface portion of a semi-conductor substrate, in which an opening is provided in the insulating film to expose a defined area of the substrate, in which a Schottky barrier is formed in said defined area and includes a metal layer covering the area of the substrate exposed through the opening, and in which a means is adapted to be applied to the metal layer for the application of pressure, characterized by substantially non-conductive barrier means effectively preventing undesirable reverse-leakage currents caused by leakage to the metal layer of electric charges from an accumulation layer formed in parts of the semi-conductor substrate closely underneath the insulating film, said non-conductive barrier means comprising a recess formed in said substrate surrounding said metal layer beneath said opening, the cross-sectional area of said opening being less than the cross-sectional area of said recess, so as to provide a separation space in said substrate that extends around the portion of the recess located underneath said insulating film, said separation space extending to the base of said recess in said semi-conductor substrate at the location where said Schottky barrier is formed, whereby said barrier means insulate said Schottky barrier from said electric charge accumulation layer.

6. A pressure-sensitive Schottky type semi-conductor device which comprises:

a semi-conductor substrate having a recess formed in a specified region of n-type conductivity;

an insulating film covering a major surface portion of said semi-conductor substrate but exposing by its opening a major part of said recess with a side-etched separation space, that extends around the recess, being located underneath the insulating film;

a metal layer covering said recess and the surrounding insulating film, which leaves said separation space substantially vacant;

a Schottky barrier which is formed on a contact face between said metal layer and said recess and is surrounded by the separation space, said separation space extending to the base of said recess in said substrate beneath said opening at the location where said Schottky barrier is formed; and means for applying an input pressing force onto said metal layer.

7. The pressure-sensitive semi-conductor device of claim 6, wherein the width of said separation space is at least 1,000 A.

8. The semi-conductor device of claim 6, wherein the semi-conductor substrate is of n-type silicon, the insulating film is of silicon dioxide, and the metal layer is of sputtered molybdenum.

9. The semi-conductor device of claim 6, wherein said means for applying the input pressure onto said metal layer includes a pressure needle imparting the input pressure onto the metal layer by way of its tip and simultaneously serving as a lead-out wire.

10. In a Schottky barrier type semi-conductor pressure sensitive device having a semi-conductor substrate, an insulating film covering a major surface portion of said substrate, an opening extending through said insulating film exposing a defined area of said substrate, a metal layer covering the area of said substrate exposed through said opening to form a Schottky barrier and means for transmitting applied pressure to said metal layer, the improvement comprising means for effectively preventing undesirable reverse leakage currents caused by leakage to said metal layer of electric charges from an accumulation layer formed in parts of said semi-conductor substrate closely beneath said insulating film, said means comprising a substantially non-conductive barrier guard space separating said metal layer from the electric charge accumulation layer said guard space comprising a recess formed in said substrate surrounding said metal layer beneath said opening, the cross-sectional area of said opening being less than the cross-sectional area of said recess, so as to provide a separation space in said substrate that extends around the portion of the recess located underneath said insulating film, said separation space extending to the base of said recess in said semi-conductor substrate at the location where said Schottky barrier is formed.

11. A pressure-sensitive semi-conductor device comprising:

a semi-conductor substrate having a recess formed in one surface portion thereof;

an insulating film formed on said one surface of said substrate within which said recess is formed, said insulating film overlapping a portion of said recess and having an opening therethrough, the cross-sectional area of which is less than the cross-sectional are a of said recess, forming a separation space in said semi-conductor substrate extending around the edges of the recess and located underneath the overlapping portion of said insulating film;

a Schottky barrier formed at the bottom of said recess comprising a metal layer formed on said insulating film and extending through said opening onto the bottom of said recess so as to form said Schottky barrier between said metal layer and the bottom of said recess, the cross-sectional area of said metal layer which so extends onto the bottom of said recess having a cross-sectional area substantially the same as said opening; and means for applying pressure onto the portion of said metal layer directly above said Schottky barrier, whereby said separation space remains substantially vacant and said Schottky barrier is surrounded by said separation sapce formed in said recess, said separation space extending to the base of said semi-conductor substrate at the location where said Schottky barrier is formed, thereby insulating said metal layer from an electric charge accumulation layer in the portion of said substrate adjacent to said recess and underneath said insulating film, so as to ensure the sensitivity of said device to forces applied thereto.

12. The semi-conductor device of claim 11, wherein said means for applying input pressure onto said metal layer includes a pressure needle imparting input pressure onto said metal layer by way of its tip and simultaneously serving as a lead-out wire.

13. A pressure-sensitive semi-conductor device comprising a semi-conductor device including three adjacent layers and two junctions therebetween and capable of transistor action, at least one of the outer layers of said three layers being a metal layer forming a metal-semi-conductor junction with the intermediate semi-conductor layer, and means for applying pressure to said metal-semi-conductor junction.

14. A pressure sensitive semi-conductor device according to claim 13, wherein said metal-semi-conductor junction is formed along the wall of a recess formed in said intermediate semi-conductor layer and is provided with a closed space void of solid material at its periphery said space being surrounded by the wall of said recess, said metal layer and an insulating layer being provided the exposed surface of said intermediate semi-conductor layer.

15. A pressure sensitive semi-conductor device according to claim 14, wherein the depth of said recess is 3,000 A or more, the lateral extension of said space is 1,000 A or more, and the thickness of said metal layer is larger than the depth of said recess.

* * * * *